(12) United States Patent
Ide

(10) Patent No.: US 11,373,916 B2
(45) Date of Patent: Jun. 28, 2022

(54) METHOD AND APPARATUS

(71) Applicant: CANON KABUSHIKI KAISHA, Tokyo (JP)

(72) Inventor: Kunihito Ide, Chigasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 205 days.

(21) Appl. No.: 16/899,439

(22) Filed: Jun. 11, 2020

(65) Prior Publication Data

US 2020/0411389 A1 Dec. 31, 2020

(30) Foreign Application Priority Data

Jun. 28, 2019 (JP) .............................. JP2019-121948

(51) Int. Cl.
| | |
|---|---|
| *H01L 51/00* | (2006.01) |
| *H01L 21/66* | (2006.01) |
| *H05K 5/00* | (2006.01) |
| *H01L 27/146* | (2006.01) |

(52) U.S. Cl.
CPC ........ *H01L 22/12* (2013.01); *H01L 27/14618* (2013.01); *H01L 27/14698* (2013.01); *H05K 5/0017* (2013.01)

(58) Field of Classification Search
CPC ........... H01L 51/0009; H01L 21/28194; H01L 21/02266
See application file for complete search history.

(56) References Cited

U.S. PATENT DOCUMENTS

| | | |
|---|---|---|
| 2007/0126914 A1 | 6/2007 | Komatsu |
| 2015/0270512 A1 | 9/2015 | Yamae |

FOREIGN PATENT DOCUMENTS

| | | |
|---|---|---|
| JP | 2015-056211 A | 3/2015 |
| JP | 2016-138992 A | 8/2016 |
| JP | 2017-134886 A | 8/2017 |
| JP | 2019-029137 A | 2/2019 |

*Primary Examiner* — Mohammad M Choudhry
(74) *Attorney, Agent, or Firm* — Canon U.S.A., Inc. IP Division

(57) ABSTRACT

A method includes preparing an electronic component that includes an element plate including an element region provided with a functional element and a peripheral region disposed around the element region, a counter plate facing the element region and the peripheral region, a first resin member disposed between at least one of the element region and the peripheral region and the counter plate, and a second resin member disposed between the peripheral region and the counter plate, applying light to the element plate through the counter plate and the second resin member, and measuring a gap between the counter plate and the element plate based on light reflected between the element plate and the second resin member and light reflected between the counter plate and the second resin member.

20 Claims, 6 Drawing Sheets

METHOD AND APPARATUS

BACKGROUND OF THE INVENTION

Field of the Invention

The present technique relates to an electronic component.

Description of the Related Art

An electronic component used in an imaging apparatus or a display apparatus includes an element plate provided with an image pickup element or a display element, a counter plate protecting a surface of the element plate, and a resin member filled in a gap between the element plate and the counter plate. The imaging apparatus and the display apparatus are used for optical purpose. Thus, to prevent light reflection at an interface between the counter plate and the resin member, a material having a refractive index close to a refractive index of the counter plate is used for the resin member.

Japanese Patent Application Laid-Open No. 2019-29137 discusses an organic electroluminescence (EL) display apparatus that includes an organic EL element unit provided in a sealed space surrounded by a first substrate, a sealing layer, and a second substrate, and a filler filled in the sealed space.

SUMMARY OF THE INVENTION

According to an aspect of the present invention, a method includes preparing an electronic component that includes an element plate including an element region provided with a functional element and a peripheral region disposed around the element region, a counter plate facing the element region and the peripheral region, a first resin member disposed between at least one of the element region and the peripheral region and the counter plate, and a second resin member disposed between the peripheral region and the counter plate, applying light to the element plate through the counter plate and the second resin member, and measuring a gap between the counter plate and the element plate based on light reflected between the element plate and the second resin member and light reflected between the counter plate and the second resin member.

Further features of the present invention will become apparent from the following description of exemplary embodiments with reference to the attached drawings.

DESCRIPTION OF THE EMBODIMENTS

Figure 1A:
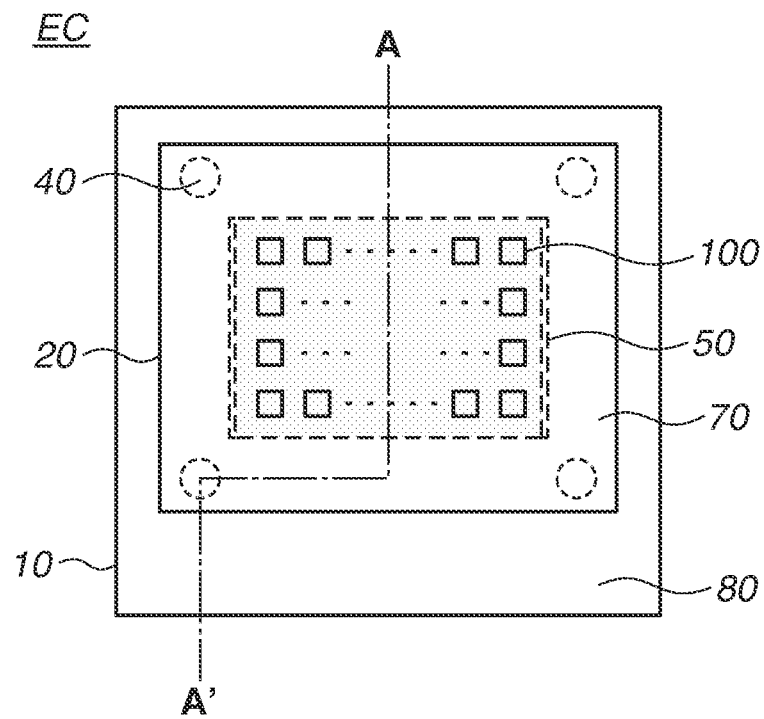
FIGS. 1A and 1B are views schematically illustrating an electronic component.

Exemplary embodiments of the present disclosure are described below with reference to the drawings. In the following description and the drawings, components common to a plurality of drawings are denoted by common reference numerals. Accordingly, the common components are described with mutual reference to the plurality of drawings, and description of the components denoted by the common reference numerals is omitted as appropriate.

Figure 1B:
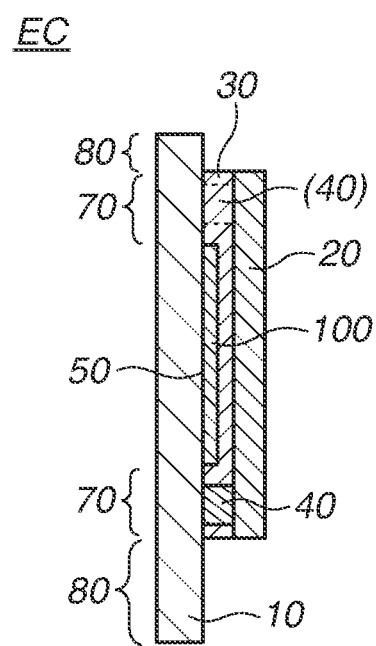

An electronic component EC in which a gap between an element plate 10 and a counter plate 20 is filled with a resin member 30 according to a first exemplary embodiment is described with reference to FIGS. 1A and 1B. FIG. 1A is a schematic top view illustrating the electronic component EC according to the first exemplary embodiment of the present disclosure. FIG. 1B is a schematic cross-sectional view taken along line A-A' in the schematic top view.

As illustrated in FIGS. 1A and 1B, the element plate 10 and the counter plate 20 are disposed, and the resin member 30 is disposed between the element plate 10 and the counter plate 20. The element plate 10 includes an element region 50 provided with a functional element 100, and a peripheral region 70 disposed around the element region 50. The counter plate 20 faces the element region 50 and the peripheral region 70. The resin member 30 is disposed between at least one of the element region 50 and the peripheral region 70 and the counter plate 20. Resin members 40 are disposed between the peripheral region 70 and the counter plate 20. A reference numeral of the resin member 30 indicated in FIG. 1B is not indicated in FIG. 1A because the resin member 30 is located at the same position as the counter plate 20 in FIG. 1A. Further, as with the resin member 30, the resin members 40 are provided between the element plate 10 and the counter plate 20 and in the peripheral region 70, which is an outer periphery of the element region 50. In other words, the resin members 40 are disposed between the peripheral region 70 and the counter plate 20. A difference between a refractive index of each of the resin members 40 and a refractive index of the counter plate 20 is 0.2 or more. The resin member 30 may be disposed between at least one of the element region 50 and the peripheral region 70 and the counter plate 20, i.e., only between the element region 50 and the counter plate 20 or only between the peripheral region 70 and the counter plate 20 element region. In the present exemplary embodiment, the resin member 30 is disposed between both the element region 50 and the peripheral region 70 and the counter plate 20. Further, the resin members 40 are each surrounded by the resin member 30.

The counter plate 20 faces both the element region 50 and the peripheral region 70. The element plate 10 according to the present exemplary embodiment includes a non-counter region 80 not facing the counter plate 20; however, the non-counter region 80 may not be provided.

The resin members 40 include a first member, a second member, and a third member that are provided separately from one another, and the third member is not located on a straight line connecting the first member and the second member. For example, in FIG. 1A, a lower-left resin member 40 is not located on a straight line connecting an upper-left resin member 40 and an upper-right resin member 40. As described above, it is preferable to arrange the three resin members 40 to form a triangle, so that the resin members 40 can stably support the counter plate 20. The resin members 40 can include the first member, the second member, and the third member that are provided separately from one another, and the third member can be located on an arc connecting the first member and the second member. In the present exemplary embodiment, the resin members 40 are provided at four positions. However, it is sufficient to provide the resin members 40 at three or more positions in total on two opposite sides or more as long as the positions are located around the element region 50. In a case where three or more resin members 40 are provided on each of the sides, the resin members 40 are preferably provided on a straight line or on an arc. Further, a shape of each of the resin members 40 at the respective positions viewed from above may be an elliptical shape, a square shape, or a rectangular shape in addition to a circler shape. As a material of each of the resin member 30 and the resin members 40, an ultraviolet (UV) curable resin, a thermosetting resin, and a two-liquid mixed resin are used. The material of each of the resin member 30 and the resin members 40 is liquid in an uncured state before treatment such as UV irradiation or heat treatment is applied or before a lapse of time.

The element plate 10 includes a glass substrate or a silicon substrate. In a case where the element plate 10 includes the glass substrate, a thin-film transistor (TFT) is formed on the glass substrate in the element region 50. In a case where the element plate 10 includes the silicon substrate, a source and a drain of a transistor are formed in the silicon substrate, and a gate thereof is formed on the silicon substrate in the element region 50. In the display apparatus or an imaging apparatus, at least one of a color filter array and a micro lens array can be disposed between the element region 50 and the resin member 30. In a case where the electronic component EC is used in the imaging apparatus, the functional element 100 is an image pickup element (photoelectric conversion element). Both the display element and the image pickup element constitute a pixel, and the element region 50 can be referred to as a pixel region. A peripheral circuit (not illustrated) is provided on the periphery of the element region 50. The peripheral circuit in the display apparatus includes a drive circuit that drives effective pixels and a processing circuit such as a digital-analog conversion circuit (DAC) that processes signals to be input to the effective pixels. The peripheral circuit in the imaging apparatus includes a drive circuit that drives effective pixels and a processing circuit such as an analog-digital conversion circuit (ADC) that processes signals output from the effective pixels.

The counter plate 20 includes a glass substrate or a resin substrate, and has light transmitting property with a refractive index in a range of 1.3 to 1.9. The refractive index of the counter plate 20 is preferably in a range of 1.4 to 1.6. As the resin member 30, an acrylic resin, an epoxy resin, and the like are suitably used. In the electronic component EC for imaging and display, light reflection that occurs at a material interface in an optical path becomes noise. Thus, the material of the resin member 30 is preferably a resin having a refractive index at which light reflection hardly occurs at an interface between the counter plate 20 and the resin member 30, and a difference between refractive indexes of the counter plate 20 and the resin member 30 is preferably 0.1 or less. The resin member 30 and the resin members 40 are preferably in contact with the counter plate 20. However, another film may be disposed between at least one of the resin member 30 and the resin members 40 and the counter plate 20. The counter plate 20 may include only the substrate such as the glass substrate or the resin substrate, or may include the substrate and a covering film covering a surface of the substrate. In addition, part of the resin member 30 may be present between each of the resin members 40 and the counter plate 20.

As illustrated in FIG. 1A, the resin member 30 is disposed over at least the entire surface of the element region 50 between the element plate 10 and the counter plate 20.

As each of as the resin members 40, a low refractive-index resin or a high refractive-index resin having a refractive index that easily causes light reflection at the interface with the counter plate 20 and that is different by 0.2 or more from a refractive index of the counter plate 20 is disposed, whereby a gap can be measured by an optical method. As each of the resin members 40, the high refractive-index resin such as an HIM series resin produced by Sumitomo Seika Chemicals Company, Ltd. and a HAL series resin produced by TOKYO OHKA KOGYO CO., LTD., or the low refractive-index resin such as a LAL series resin produced by TOKYO OHKA KOGYO CO., LTD. is suitably used.

Next, a method of manufacturing the electronic component EC according to the exemplary embodiment of the present disclosure is described with reference to FIGS. 2A to 2C. In each of FIGS. 2A to 2C, a diagram on a left side is a schematic plan view of the components of the electronic component EC, and a diagram on a right side is a schematic cross-sectional view taken along line A-A' illustrated in the schematic plan view.

Figure 2A:
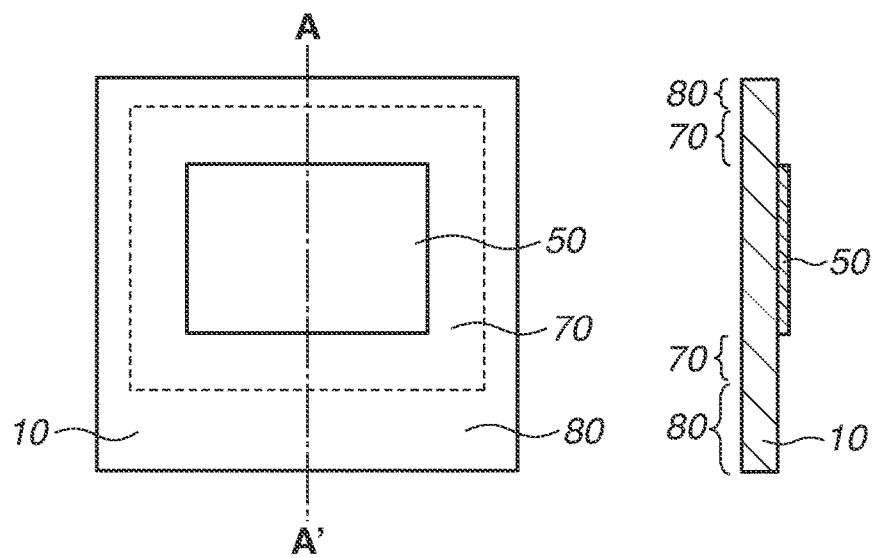
FIGS. 2A, 2B, and 2C are views schematically illustrating a method of manufacturing the electronic component.

In a step illustrated in FIG. 2A, the element plate 10 that includes the element region 50 provided with the functional element 100 and the peripheral region 70 disposed around the element region 50 is prepared. As illustrated in FIG. 2A, the element region 50 is disposed on the element plate 10. In the element region 50, the functional element 100, the semiconductor element (not illustrated) that controls the functional element 100, and the wiring layer (not illustrated) are provided. The functional element 100 is not illustrated in figures after FIG. 2A.

Figure 2B:
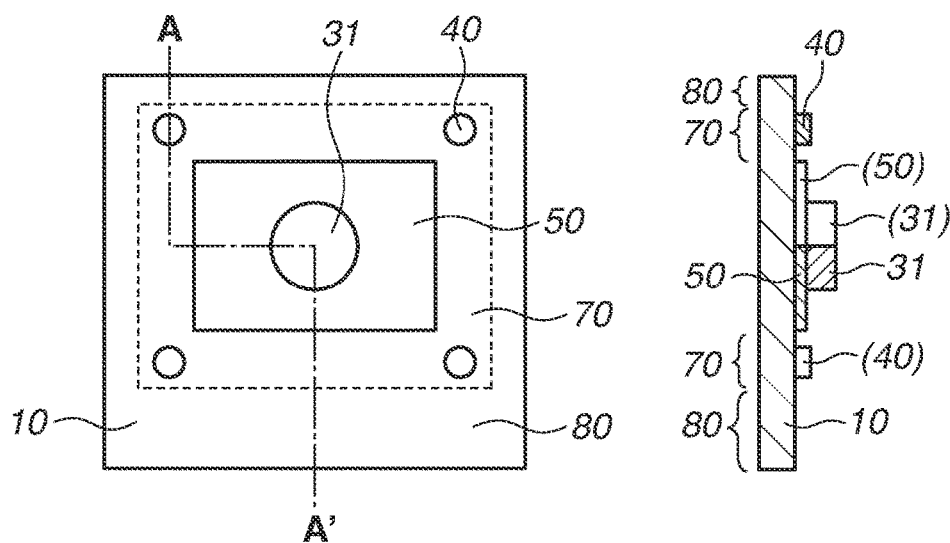

Next, in a step illustrated in FIG. 2B, a solid resin material serving as the resin members 40 is disposed in the peripheral region 70. Further, in the step illustrated in FIG. 2B, a liquid resin material 31 to be the resin member 30 is disposed in the element region 50. The liquid resin material 31 is preferably disposed after the solid resin members 40 are disposed; however, the solid resin members 40 and the liquid resin material 31 may be disposed in a reverse order. At this time, the solid resin material serving as the resin members 40 and the liquid resin material 31 to be the resin member 30 are separated from each other. As illustrated in FIG. 2B, the resin members 40 are disposed outside the element region 50. A diameter of each of the resin members 40 viewed from above is preferably larger than a spot diameter of light used in the optical measurement method. For example, in a case where a laser displacement sensor CL-P007 manufactured by Keyence Corporation is used, the diameter of each of the resin members 40 is preferably 50 μm or more after the counter plate 20 is bonded. Thus, a liquid resin material 41 to be the resin members 40 is disposed by an application method so that the diameter of each of the resin members 40 is 50 μm or more, and the liquid resin material 41 is cured to form the solid resin members 40. In FIG. 2B, the resin members 40 are disposed at four positions. However, it is sufficient to provide the resin members 40 at three or more positions in total on two opposing sides or more. The resin members 40 are preferably separated from one another. In a case where three or more resin members 40 are provided on each of the sides, the resin members 40 are preferably provided on a straight line or on an arc. An amount of the resin material 31 is calculated from the gap between the element plate 10 and the counter plate 20 and an area of each of the element region 50 and the counter plate 20, and the resin material 31 is disposed at a substantially center of the element region 50. In the present exemplary embodiment, the counter plate 20 has a size of 15 mm×20 mm, and the gap has a distance of 0.005 mm. In this case, a necessary volume of the resin material 31 is 1.5 mm³. Further, when the diameter of each of the resin members 40 viewed from above is 1 mm, a necessary volume of the resin material 31 for each of the resin members 40 is 0.0039 mm³.

Figure 2C:
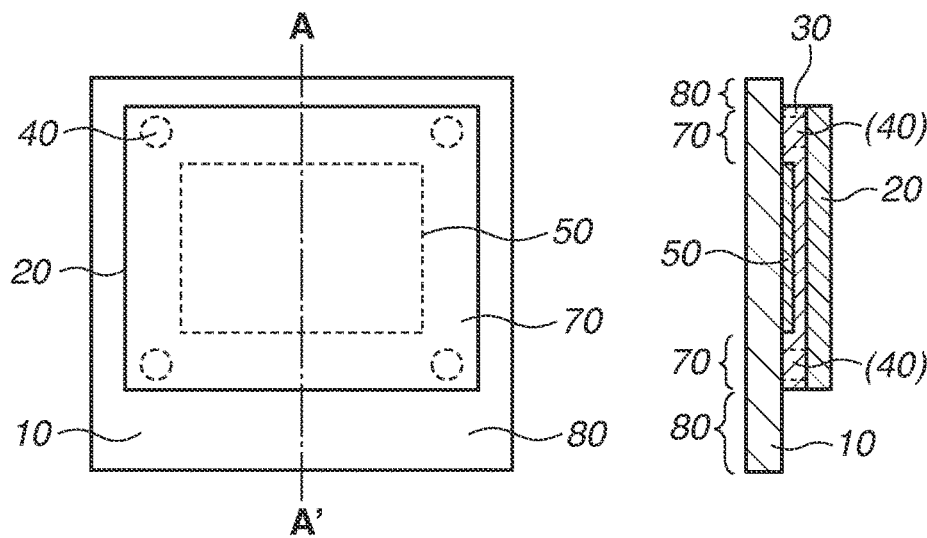

Next, in a step illustrated in FIG. 2C, the counter plate 20 facing the element region 50 and the peripheral region 70 is disposed so as to come into contact with the solid resin material serving as the resin members 40 and the liquid resin material 31. Then, the liquid resin material 31 is caused to flow and is brought into contact with the solid resin material serving as the resin members 40. In other words, the resin material 31 to be the resin member 30 is pressed by the counter plate 20 to flow, while spreading, along a main surface of the counter plate 20, and the counter plate 20 is bonded. The resin material 31 to be the resin member 30 may protrude or not protrude outside the main surface from the gap between the counter plate 20 and the element plate 10; however, the resin material 31 preferably covers the entire surface of the element region 50. Further, to prevent the resin material 31 to be the resin member 30 from entering between each of the resin members 40 and the counter plate 20, a bonding speed and the like are appropriately adjusted. The gap between the counter plate 20 and the element plate 10 is controlled by mechanically moving a position of each of the counter plate 20 and the element plate 10.

Further, in the step illustrated in FIG. 2C, the liquid resin material 31 to be the resin member 30 by being subjected to curing treatment is cured by a curing method suitable for the resin material 31, such as UV curing, thermal curing, and a lapse of time after two liquid are mixed. In such a manner, the counter plate 20 is bonded to the element plate 10 through the resin member 30 as illustrated in FIG. 2C.

In the present exemplary embodiment, the example in which the solid resin members 40 are first formed, and then the liquid resin material 31 is disposed has been described. Alternatively, the liquid resin material 31 to be the resin member 30 and the liquid resin material 41 to be the solid resin members 40 may be disposed, and then, both of materials may be cured. In such a case, the liquid resin material 31 to be the resin member 30 and the liquid resin material 41 to be the solid resin members 40 may be disposed in any order and may be disposed at the same time. Alternatively, the resin member 30 may be first formed, and then the liquid resin material 41 to be the resin members 40 may be disposed.

Figure 3A:
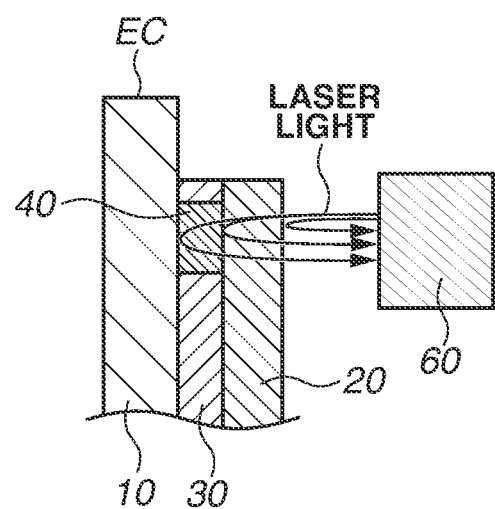
FIGS. 3A and 3B are views schematically illustrating a method of inspecting the electronic component.

A method of inspecting the electronic component EC is described with reference to FIGS. 3A and 3B. FIG. 3A is a cross-sectional view schematically illustrating a vicinity of one of the resin members 40 in FIG. 2C. As illustrated in FIG. 3A, the gap between the counter plate 20 and the element plate 10 is measured at a position where the resin member 40 is provided by an optical method using a laser displacement sensor. Light is applied to the element plate 10 through the counter plate 20 and the resin member 40, and light reflected at an interface between the element plate 10 and the resin member 40 and light reflected at an interface between the counter plate 20 and the resin member 40 are received. The gap between the counter plate 20 and the element plate 10 is measured using the received light. The gap between the counter plate 20 and the element plate 10 is determined from a difference between a position of reflection occurred on a surface of the element plate 10 and a position of reflection occurred at the interface between the counter plate 20 and the resin member 40. In the exemplary embodiment, the example is described where the electronic component EC is inspected after the electronic component EC is completed. Alternatively, the gap between the counter plate 20 and the element plate 10 may be measured during manufacture of the electronic component EC, for example, before the resin material 31 to be the resin member 30 is cured. Further, the gap between the counter plate 20 and the element plate 10 may be adjusted based on the measured gap before the resin material 31 is cured.

Figure 3B:
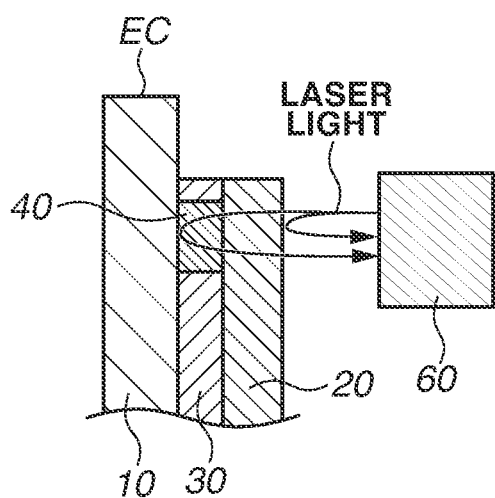

In a case where the difference between the refractive indexes of the resin member 40 and the counter plate 20 is less than 0.2, it is difficult to detect the reflection of laser light of the laser displacement sensor at the interface between the resin member 40 and the counter plate 20 as illustrated in FIG. 3B. Thus, the position of the interface between the counter plate 20 and the resin member 40 cannot be specified, and it is difficult to measure the gap between the counter plate 20 and the element plate 10. Likewise, in a case where a difference between the refractive indexes of the resin member 30 and the counter plate 20 is 0.1 or less, it is difficult to detect reflection of the laser light of the laser displacement sensor at the interface between the resin member 30 and the counter plate 20. Thus, the position of the interface between the resin member 30 and the counter plate 20 cannot be specified, and it is difficult to measure the gap between the counter plate 20 and the element plate 10. In the element plate 10 for displaying an image or the element plate 10 for imaging, light reflection that occurs at a material interface in an optical path becomes noise. The resin member 30 covering the element region 50 preferably has the refractive index at which light reflection hardly occurs at the interface between the counter plate 20 and the resin member 30. Thus, the gap cannot be measured by the optical method. However, the resin member 40 disposed in the peripheral region 70 of the element region 50 is not located in the optical path in the element region 50. Thus, it is unnecessary for the resin member 40 to have the refractive index close to the refractive index of the counter plate 20. Accordingly, if the resin member 40 having a refractive index different by 0.2 or more from the refractive index of the counter plate 20 is used, light reflection at the interface between the counter plate 20 and the resin member 40 is increased, whereby gap measurement by the optical method becomes possible.

In a case where the counter plate 20 is bonded in a state where a foreign substance having a size larger than or equal to a gap distance is present in the gap between the counter plate 20 and the element plate 10, the element plate 10 and the counter plate 20 may be damaged. There is a case where damage gradually progresses to a detectable level after, for example, one month. Thus, it is difficult to detect all of damages in a damage inspection step provided immediately after bonding. Thus, in process management, it is necessary to manage an allowable size of the foreign substance and to manage that the gap is not narrower than an expected distance, i.e., to manage a gap allowable value. With use of the electronic component EC according to the present exemplary embodiment, the gap can be easily measured and managed.

There is known a method of measuring the gap between the element plate and the counter plate by using a spherical-shaped gap measurement member and measuring a deformation amount of the gap measurement member. However, the method has an influence such as stress on an adjacent resin member since the gap is measured based on deformation of the gap measurement member that is an elastic body. Further, the resin member near the gap measurement member also deforms due to the deformation of the gap measurement member, which may cause an issue such as a change in the refractive index of the resin member or generation of a void. In a state where the resin member 30 and the resin members 40 are solid after curing, it is possible to reduce application of stress from the resin member 40 to the resin member 30 as compared with the case of using the elastic body. Further, it is possible to prevent the change in the refractive index of the resin member 30 and the generation of the void.

In the imaging apparatus and the display apparatus, the light reflected at the interface between the counter plate 20 and the resin member 30 is weak since the resin member 30 having the refractive index equivalent to the refractive index of the counter plate 20 is used, whereby it is difficult to optically measure the gap. The present technique can prevent the change in the refractive index of the resin member 30 and the generation of the void in the step of bonding the counter plate 20 to the element plate 10.

Figure 4A:
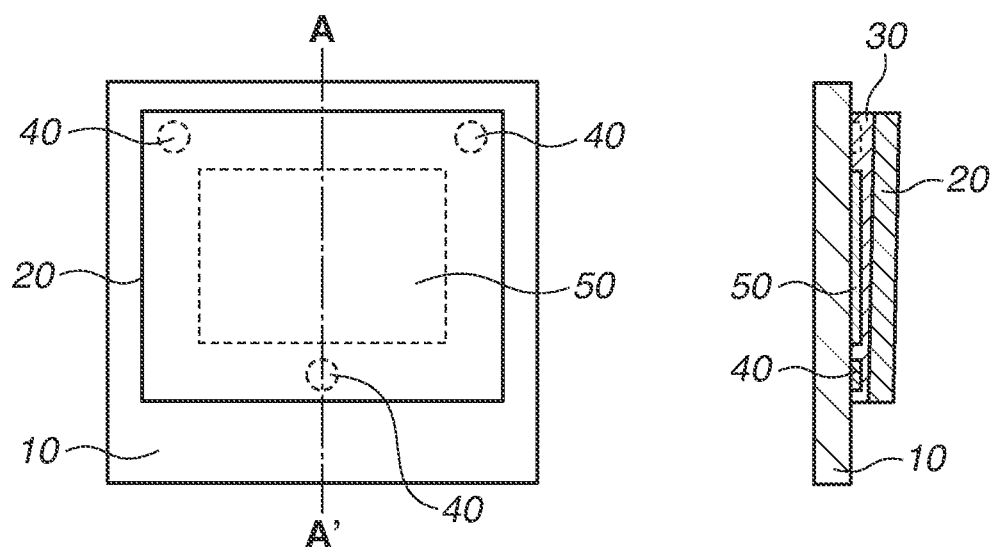
FIGS. 4A and 4B are views each schematically illustrating an electronic component.

An electronic component EC in which the gap between the element plate 10 and the counter plate 20 is filled with the resin member 30 according to a second exemplary embodiment is described with reference to FIGS. 4A and 4B. In each of FIGS. 4A and 4B, a diagram on a left side is a schematic plan view of components of the electronic component EC, and a diagram on a right side is a schematic cross-sectional view taken along line A-A' illustrated in the schematic plan view.

The present exemplary embodiment is different from the first exemplary embodiment in arrangement positions of the resin members 40. As illustrated in FIG. 4A, the resin members 40 that enable gap measurement are separately disposed at three or more positions not on a straight line, so that an inclination of the gap between the counter plate 20 and the element plate 10 can be measured. As a result, gap distribution in the element region 50 can be determined as the inclination by calculation. This is described using specific numerals. An upper-left coordinate of the element region 50 in FIG. 4A is defined as (X=0, Y=0), and rightward and downward directions as viewed from above are each defined as a positive direction. The element region 50 has a size of 15 mm in the X direction and 10 mm in the Y direction. With regard to the upper-left resin member 40, a coordinate (X, Y) of a gap measurement position and a gap distance G between the counter plate 20 and the element plate 10 are represented as (X, Y, G)=(−1 mm, −1 mm, 0.010 mm). Likewise, with regard to the upper-right resin member 40, the coordinate (X, Y) and the gap distance G are represented as (X, Y, G)=(16 mm, −1 mm, 0.009 mm). With regard to the lower resin member 40, a coordinate (X, Y) and the gap distance G are represented as (X, Y, G)=(7.5 mm, 11 mm, 0.008 mm). Based on these values, an equation representing a plane of the gap distance is expressed as $0.012X+0.0255Y+204G-2.0025=0$. In the element region 50, a position where the gap distance G becomes the smallest is a position of (X, Y)=(15 mm, 10 mm), and the gap distance G is 0.077 from calculation. The process management can be performed by comparing the gap distance G with a predetermined gap allowable value.

In a case where one or both of the counter plate 20 and the element plate 10 are warped, due to arrangement of the resin members 40 at three or more positions on a straight line or on an arc on one side, the gap distribution in the element region 50 can be obtained as deformation amount distribution by calculation.

Figure 4B:
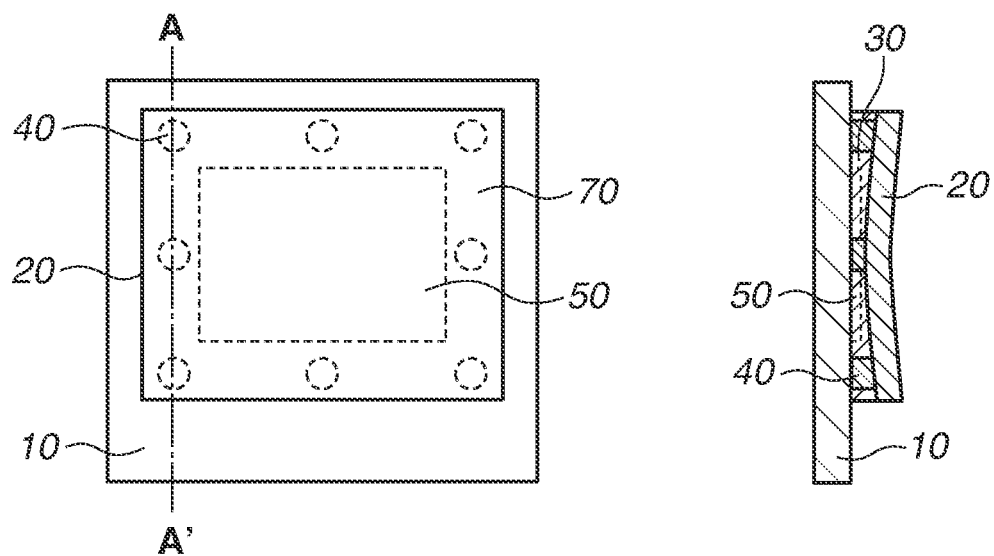

As illustrated in FIG. 4B, if the resin members 40 are disposed at three or more positions on each of two or more sides of the peripheral region 70 of the element region 50, the narrowest gap in the element region 50 can be obtained by calculation. More specifically, the resin members 40 include the first member, the second member, and the third member that are provided separately from one another, and the third member is located on a straight line connecting the first member and the second member. For example, in FIG. 4B, a middle-left resin member 40 is located on a straight line connecting an upper-left resin member 40 and a lower-left resin member 40. With use of the configuration according to the present exemplary embodiment, it is possible to obtain, by calculation, the narrowest gap in the element region 50, direct measurement of which is not appropriate, and to easily manage the gap.

Figure 5A:
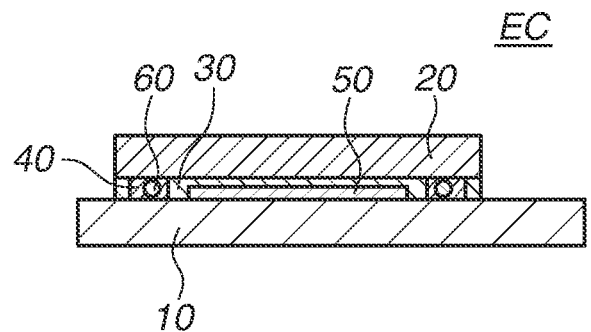
FIGS. 5A, 5B, and 5C are views schematic ally illustrating the electronic component.
Figure 5B:
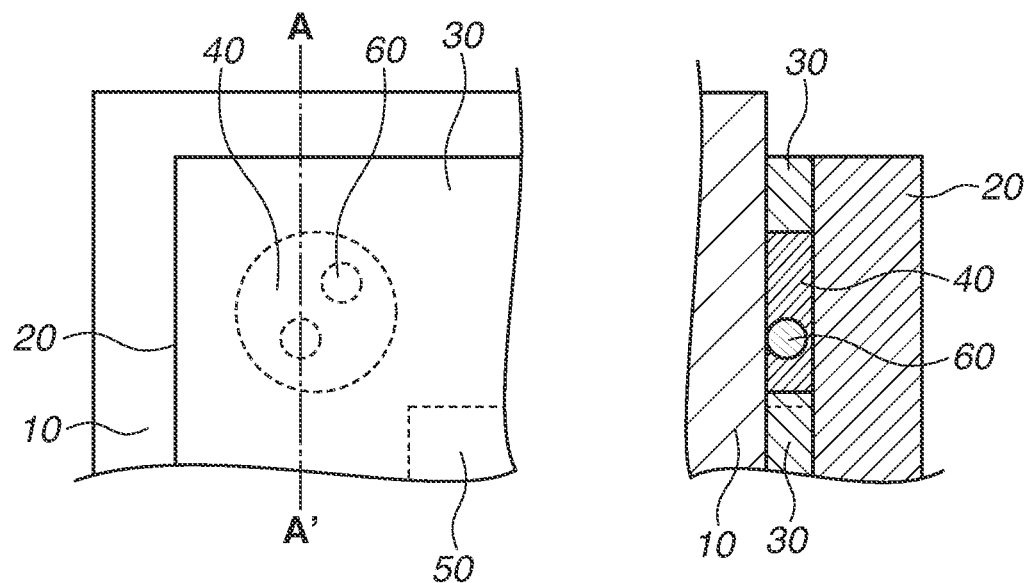
Figure 5C:
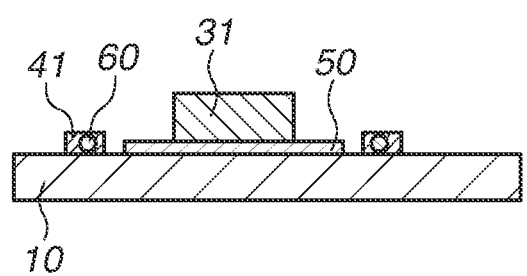

An electronic component EC in which the gap between the element plate 10 and the counter plate 20 is filled with the resin member 30 according to a third exemplary embodiment is described with reference to FIGS. 5A to 5C. FIG. 5A illustrates a modification of FIG. 1B. FIG. 5B illustrates a periphery of the resin member 40 in FIG. 5A in an enlarged manner. In FIG. 5B, a diagram on a left side is a schematic plan view of components of the electronic component EC, and a diagram on a right side is a schematic cross-sectional view taken along line A-A' in the schematic plan view.

The third exemplary embodiment is different from the first exemplary embodiment illustrated in FIGS. 1A and 1B in that a spacer 60 is provided between the element plate 10 and the counter plate 20, and the spacer 60 is covered with the resin member 40. In other words, the resin member 40 contains the spacer 60. The spacer 60 is typically a spherical object made of a resin, ceramic, glass, or the like that is selected so as to form a desired gap. The resin member 40 contains at least one spacer 60. As illustrated in FIG. 5B, the spacer 60 is in contact with the counter plate 20 and the element plate 10.

A manufacturing method according to the third exemplary embodiment is described with reference to FIG. 5C. As illustrated in FIG. 5C, the element plate 10 is disposed so that the element region 50 faces upward, and the liquid resin material 31 to be the resin member 30 is applied to the element region 50. The liquid resin material 41 to be the resin members 40, in which the spacer 60 is mixed, is disposed in the peripheral region 70 of the element region 50.

Next, as illustrated in FIG. 5A, the counter plate 20 is bonded. More specifically, the counter plate 20 is moved above the element plate 10, and then, the counter plate 20 is moved by its own weight or by a controlled force until the counter plate 20 comes in contact with the spacer 60. In the first exemplary embodiment, the gap is controlled by mechanically moving the position of each of the counter plate 20 and the element plate 10, whereas the gap is controlled by the spacer 60 in the present exemplary embodiment. After the liquid resin material 31 to be the resin member 30 is disposed and before the counter plate 20 is disposed, the resin material 41 to be the resin member 40 is liquid containing the spherical spacer 60. Thus, the distance between the element plate 10 and the counter plate 20 can be controlled by the spacer 60. However, if the resin material 41 has been already cured to the solid resin members 40, the effect of using the spacer 60 is impaired because the distance between the element plate 10 and the counter plate 20 can be specified by the thickness of each of the resin members 40.

After the counter plate 20 is disposed, the resin materials 31 and 41 are cured. The liquid resin material 31 to be the resin member 30 and the liquid resin material 41 to be the resin member 40 are cured by the respective curing methods to form the solid resin member 30 and the solid resin members 40.

Then, the gap is measured by a gap measurement unit. At this time, the gap is measured at part of the resin member 40 where the spacer 60 is not present. The reason is as follows. The spacer 60 typically has a spherical shape, and a contact point thereof is a point in principle. Thus, the contact point is much smaller than 50 µm, which is a spot diameter of the laser light used in the measurement. Accordingly, in a case where the spacer having a diameter of 10 µm is used, the contact point thereof is 1 µm or less. Even if a difference between refractive indexes of the spacer 60 and the counter plate 20 is 0.2 or more, it is difficult to measure the gap with use of the contact point. Further, even at part other than the contact point, if both the resin member 40 and the spacer 60, each having the different refractive index, are present in the optical path of the laser light, it is difficult to accurately measure the gap due to influence of reflection at an interface between the resin member 40 and the spacer 60.

In a case where the spacer 60 is largely deformed due to a strong pressing force applied by the apparatus to the counter plate 20 that comes into contact with the spacer 60, or in a case where the spacer 60 is not present or does not appropriately function, the intended gap may not be obtained. However, with use of the configuration according to the present exemplary embodiment, it is possible to easily manage the gap. Further, the gap management can also be performed in a case where the configuration according to the present exemplary embodiment is combined with the configuration according to the second exemplary embodiment.

A configuration according to a fourth exemplary embodiment is described. In the fourth exemplary embodiment, three types of resin members are disposed between the element plate 10 and the counter plate 20. The resin member 30 is provided at least in the element region 50. The resin member 40 is provided at least in the peripheral region 70. In addition, a peripheral resin member (not illustrated) is further provided between the peripheral region 70 and the counter plate 20. The resin member 40 may come into contact with the peripheral resin member, and the resin member 40 may be surrounded by the peripheral resin member. The resin member 30 may be surrounded by the peripheral resin member. A difference between a refractive index of the peripheral resin member and the refractive index of the counter plate 20 is preferably larger than the difference between the refractive index of the resin member 30 and the refractive index of the counter plate 20. Further, the difference between the refractive index of the peripheral resin member and the refractive index of the counter plate 20 is preferably smaller than the difference between the refractive index of the resin member 40 and the refractive index of the counter plate 20. For example, as the material of the resin member 30, a resin material having high transmittance or a resin material small in a refractive index difference with the counter plate 20 is selectable. In this case, a bonding force of the resin member 30 to the element plate 10 and the counter plate 20 may be low. By selecting, as the material of the peripheral resin member, a resin material having a high bonding force to the element plate 10 and the counter plate 20, both optical characteristics and bonding performance can be achieved. Further, by using the resin member 40 advantageous for gap measurement, the gap management can be performed with high accuracy.

Figure 6:
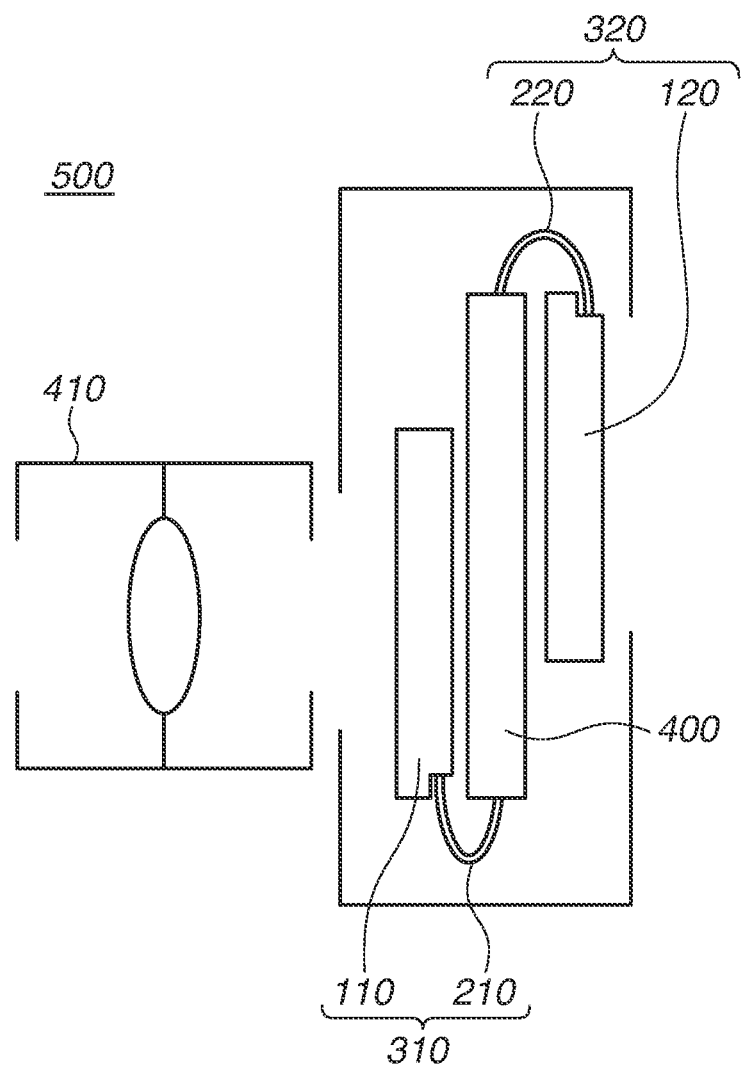
FIG. 6 is a view schematically illustrating an apparatus.

FIG. 6 is a view schematically illustrating a configuration of an apparatus 500 to which the electronic component EC according to any of the above-described exemplary embodiments is applied. Examples of the apparatus 500 includes an electronic apparatus such as a camera, a display, and a mobile information terminal, a transportation apparatus such as a vehicle, a ship, an aircraft, and a satellite, a medical apparatus such as an endoscope and a radiation diagnostic apparatus, and an analyzer. The electronic component EC is suitable for the apparatus 500 that includes an imaging function and/or a display function.

The apparatus 500 includes a circuit component 400 mounted with a semiconductor element as an integrated circuit component. An imaging component 310 includes an image pickup element 110 and a wiring component 210, and the wiring component 210 is connected to the circuit component 400. A display component 320 includes a display element 120 and a wiring component 220, and the wiring component 220 is connected to the circuit component 400. The imaging component 310 may include the above-described electronic component EC. In such a case, the image pickup element 110 corresponds to the above-described functional element 100, and the wiring component 210 corresponds the above-described wiring layer. The display component 320 may include the above-described electronic component EC. In such a case, the display element 120 corresponds to the above-described functional element 100, and the wiring component 220 corresponds to the above-described wiring layer. The display element 120 can constitute an electronic view finder. In the apparatus 500, a lens 410 forming an image on the image pickup element 110 is detachable. A camera as the apparatus 500 may be a reflex camera or a non-reflex camera.

A thickness of the electronic component EC in which the wiring layer is joined to the element plate 10 through an electroconductive member 150 is a sum of thicknesses of members in a case where the members are stacked in a vertical direction. The electronic component EC including the element plate 10 is to be used by being built in the apparatus 500. Thus, downsizing of the electronic component EC is required. Reduction of a thickness of the element plate 10 by a thickness of the electroconductive member 150 does not contribute much to the downsizing of the electronic component EC since the thickness of the electroconductive member 150 accounts for a small proportion as compared with the thickness of the element plate 10 or the wiring layer. However, provision of a recessed portion 50 in which an insulation portion 202 of the wiring layer is disposed enables provision of the downsized electronic component EC and downsizing of the apparatus 500 or an increase in mounting density of the components.

If a foreign substance enters a gap between the counter plate and the element plate, and if the gap between the counter plate and the element plate is narrower than an allowable height of the foreign substance, the foreign substance is pressed by the counter plate, and a force from the counter plate is applied to the element plate via the foreign substance. The image pickup element and the display element on the element plate may be damaged by the force. Thus, it is desirable to inspect the gap between the counter plate and the element plate. However, if a difference between the refractive indexes of the counter plate and the resin member is small, light reflection at the interface between the counter plate and the resin member is small. This causes an issue that the gap between the counter plate and the element plate cannot be optically measured or measurement accuracy is not sufficient. In addition, insufficient inspection leads to reduction in reliability of the electronic component.

Accordingly, the present disclosure is directed to a technique advantageous to improve the reliability of the electronic component.

According to an aspect of the present disclosure, an electronic component includes an element plate including an element region provided with a functional element and a peripheral region provided around the element region, a counter plate facing the element region and the peripheral region, a first resin member disposed between at least one of the element region and the peripheral region and the counter plate, and a second resin member disposed between the peripheral region and the counter plate. A difference between a refractive index of the second resin member and a refractive index of the counter plate is 0.2 or more.

The exemplary embodiments of the present disclosure can provide the technique advantageous to improve the reliability of the electronic component.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-121948, filed Jun. 28, 2019, which is hereby incorporated by reference herein in its entirety.

What is claimed is:

1. A method comprising:
preparing an electronic component that includes an element plate including an element region provided with a functional element and a peripheral region disposed around the element region, a counter plate facing the element region and the peripheral region, a first resin member disposed between at least one of the element region and the peripheral region and the counter plate, and a second resin member disposed between the peripheral region and the counter plate;
applying light to the element plate through the counter plate and the second resin member; and
measuring a gap between the counter plate and the element plate based on light reflected between the element plate and the second resin member and light reflected between the counter plate and the second resin member.

2. The method according to claim 1, wherein a difference between a refractive index of the second resin member and a refractive index of the counter plate is larger than a difference between a refractive index of the first resin member and the refractive index of the counter plate.

3. The method according to claim 1, wherein a difference between a refractive index of the second resin member and a refractive index of the counter plate is 0.2 or more.

4. The method according to claim 1, wherein a difference between a refractive index of the first resin member and a refractive index of the counter plate is 0.1 or less.

5. The method according to claim 1,
wherein the second resin member includes a first member, a second member, and a third member that are provided separately from one another, and
wherein the third member is not located on a straight line connecting the first member and the second member.

6. The method according to claim 1,
wherein the second resin member includes a first member, a second member, and a third member that are provided separately from one another, and
wherein the third member is located on a straight line connecting the first member and the second member.

7. The method according to claim 1,
wherein the second resin member includes a first member, a second member, and a third member that are provided separately from one another, and
wherein the third member is located on an arc connecting the first member and the second member.

8. The method according to claim 1, wherein a spacer is provided between the element plate and the counter plate, and the spacer is covered with the second resin member.

9. The method according to claim 1,
wherein the first resin member is disposed between the counter plate and both the element region and the peripheral region, and
wherein the second resin member is surrounded by the first resin member.

10. The method according to claim 1,
wherein the first resin member is provided at least in the element region,
wherein a third resin member is disposed between the peripheral region and the counter plate, and
wherein a difference between a refractive index of the third resin member and a refractive index of the counter plate is larger than a difference between a refractive index of the first resin member and the refractive index of the counter plate, and is smaller than a difference between a refractive index of the second resin member and the refractive index of the counter plate.

11. The method according to claim 1, wherein the element plate includes a region not facing the counter plate.

12. The method according to claim 1, wherein the first resin member and the second resin member are in contact with the counter plate.

13. The method according to claim 1, wherein the functional element is a display element or a photoelectric conversion element.

14. The method according to claim 1, wherein the counter plate includes a glass substrate.

15. The method according to claim 1, wherein the element plate includes a silicon substrate.

16. The method according to claim 1, wherein a color filter array is disposed between the element region and the first resin member.

17. The method according to claim 1, wherein a micro lens array is disposed between the element region and the first resin member.

18. An apparatus comprising:
an electronic component inspected by the method according to claim 1;
a wiring component connected to the electronic component; and
a circuit component connected to the electronic component via the wiring component.

19. A method comprising:
preparing an element plate including an element region provided with a functional element and a peripheral region disposed around the element region;
disposing a second resin material in the peripheral region;
disposing a liquid first resin material in the element region;
causing the first resin material to flow and bringing the first resin material into contact with the second resin material after a counter plate facing the element region and the peripheral region is disposed to come into contact with the first resin material and the second resin material; and
curing the first resin material.

20. The method according to claim 19, wherein the second resin material is liquid containing a spherical spacer before the counter plate is disposed, and the second resin material is cured after the counter plate is disposed.

* * * * *